United States Patent
Shimazaki

(10) Patent No.: US 7,999,177 B2
(45) Date of Patent: Aug. 16, 2011

(54) OPTICAL THIN FILM FOR SOLAR CELLS AND METHOD OF FORMING THE SAME

(75) Inventor: Kazunori Shimazaki, Tsukuba (JP)

(73) Assignee: Japan Aerospace Exploration Agency, Tokyo (JP)

( * ) Notice: Subject to any disclaimer, the term of this patent is extended or adjusted under 35 U.S.C. 154(b) by 935 days.

(21) Appl. No.: 11/416,684

(22) Filed: May 2, 2006

(65) Prior Publication Data

US 2006/0243320 A1    Nov. 2, 2006

(30) Foreign Application Priority Data

May 2, 2005 (JP) .................. 2005-134496

(51) Int. Cl.
*H01L 31/0216* (2006.01)
(52) U.S. Cl. ........... 136/257; 136/256; 136/252; 438/72
(58) Field of Classification Search .......... 136/243–265; 428/428, 431, 432, 697, 699, 701; 359/580
See application file for complete search history.

(56) References Cited

U.S. PATENT DOCUMENTS

| | | | | |
|---|---|---|---|---|
| 4,598,164 A | * | 7/1986 | Tiedje et al. | 136/249 |
| 4,846,151 A | * | 7/1989 | Simko, Jr. | 126/658 |
| 5,449,413 A | * | 9/1995 | Beauchamp et al. | 136/257 |
| 6,720,081 B2 | * | 4/2004 | Vitt et al. | 428/432 |
| 2006/0093786 A1 | * | 5/2006 | Ohashi et al. | 428/131 |

FOREIGN PATENT DOCUMENTS

| | | |
|---|---|---|
| EP | 0 372 929 A2 | 6/1990 |
| EP | 0 632 507 A2 | 1/1995 |
| EP | 1 054 455 A2 | 11/2000 |
| GB | 2 124 826 A | 2/1984 |
| JP | 63-033872 A | 2/1988 |
| JP | 07-058355 A | 3/1995 |
| WO | WO 01/46718 A2 | 6/2001 |

OTHER PUBLICATIONS

CERAC Inc., Aluminum Oxide, Al2O3, For Optical Coating, Technical Publication, 2004. Downloaded from http://web.archive.org/web/20041204215106/http://www.cerac.com/pubs/proddata/al2o3.htm, Sep. 10, 2010.*

(Continued)

*Primary Examiner* — Jennifer K. Michener
*Assistant Examiner* — Jayne Mershon
(74) *Attorney, Agent, or Firm* — Blakely, Sokoloff, Taylor & Zafman LLP

(57) ABSTRACT

Disclosed is an optical thin film for a thin-film solar cell, which is formed directly on a top surface of the thin-film solar cell having a transparent conductive film layer to provide a high infrared emissivity and a lower solar absorptivity to the thin-film solar cell. The optical thin film is formed through a vacuum vapor deposition process. The thin film makes it possible to provide enhanced infrared emissivity based on its reduced thickness, while suppressing unnecessary incoming solar radiation in a simplified structure to achieve a reduced solar absorptivity so as to maintain desired cell efficiency. The optical thin film of the present invention is capable of achieving reduction in weight of a solar cell, and suitable for use, particularly, in space environments.

7 Claims, 3 Drawing Sheets

OTHER PUBLICATIONS

C. Kitchen, et al. "Solar cell coverglasses for satellites in the intermediate earth orbit," 26$^{th}$ PVSC, 1997, IEEE, Anaheim, California, pp. 1011-1014, 0-7803-3767-0/97.

Akira Ohnishi, et al. "Development of a New Borosilicate Cover Glass and a Second Surface Mirror for Spacecrafts," 1995, T. IEE Japan, vol. 115-A, No. 6, pp. 471-478.

John R. Tuttle, et al. "A 15.2% AM0/1433 W/kg thin-film Cu(In,Ga)Se$_2$ solar cell for space applications," Sep. 2000, 28$^{th}$ IEEE Photovoltaics Specialists Conference, Anchorage, Alaska.

Martin Kroon, et al. "End-of-life power predictions of Cu(In,Ga)Se$_2$ solar cells," Dutch Space B.V., division Solar Arrays, Leiden, the Netherlands, dated 2004.

G.L. Oomen, et al. "Development of a thin, high-emissivity coating for flexible solar cells," May 2005, ESA SP-589, Seventh European Space Power Conference, Stressa, Italy.

* cited by examiner

OPTICAL THIN FILM FOR SOLAR CELLS AND METHOD OF FORMING THE SAME

CROSS-REFERENCE TO OTHER APPLICATIONS

The present patent application claims priority from Japanese Patent Application No. 2005-134496, filed on May 2, 2005.

TECHNICAL FIELD

The present invention relates to a technique of an optical thin film for thin-film solar cells, for allowing an on-ground thin-film solar cell with a top layer formed of a transparent conductive film to have improved thermal radiative and optical characteristics suitable for use in space environments.

BACKGROUND ART

In a crystal-based solar cell for use in space, a cover glass using borosilicate glass as a base material and having a high infrared emissivity is attached thereonto. Based on the high emissivity, the cover glass serves as means for releasing heat from a surface of the glass to outer space. In space applications of a thin-film solar cell which has been originally developed for use on the ground, if the conventional space cover glass is used therein, advantages of the thin-film solar cell will be spoiled in terms of weight and flexibility. Differently from the crystal-based solar cell, most of the thin-film solar cells have a top layer formed of a transparent conductive film with a low infrared emissivity. Therefore, if such a thin-film solar cell is used in space without any measures, it will have a higher temperature than usual due to insufficient heat release to cause deterioration in cell efficiency. While there is a technique of enclosing an on-ground solar cell with an organic material, mechanical/optical characteristics of the organic material are highly likely to deteriorate in space due to harsh radiation environment. Thus, a new heat control technique as an alternative to the cover glass is essentially required to use a thin-film solar cell in an adequate temperature range in space environments.

As a technique for shielding unnecessary solar radiation, there has been known a cover glass applied with a Blue Red Reflector (BRR) coating. This cover glass is formed with several dozen layers of an optical thin film on each of front and rear surfaces thereof to reflect ultraviolet rays and near-infrared lights so as to prevent excess thermal input and achieve lower temperature of a solar cell in space environments. Even though this cover glass is excellent in performance, it involves problems about its complicated forming process and the need for optimizing film-forming parameters of the optical film, such as a substrate temperature (a temperature of a substrate of the solar cell), in consideration of a thin-film solar cell. Thus, it is required to develop an optical film capable of being produced in a simplified manner through a film-forming process suitable for a thin-film solar cell.

[Non-Patent Publication 1] C. Kitchen, K. Mullaney, M. Price, A. Dollery, K. Fyles, H. Eaves, R. Crabb and P. Buia, "Solar cell coverglass for satellites in the intermediate earth orbit", Conference record of the 26th IEEE Photovoltaic Specialists Conference (1997) 1011-1014

[Non-Patent Publication 2] A. Ohnishi, T. Onoda, S. Yamamoto, S. Sanbe, Y Morita, "Development of a New Borosilicate Cover Glass and a Second Surface Mirror for Spacecrafts" Trans. IEE of Japan Vol. 115-A No. 6, (1995) pp 471 to 478

[Non-Patent Publication 3] J. R. Tuttle, A. Szalaj and J. Keane, "A 15. 2% AM0/1433 W/kg thin-film Cu(In, Ga)Se$_2$ Solar cell for space applications", Proceedings of 28th IEEE Photovoltaic Specialists Conference (2000)

[Non-Patent Publication 4] M. Kroon, G. Oomen, and R. van der Heijden, "End-of-Life power predictions of Cu(In, Ga)Se$_2$ solar cell", Proceedings of 3rd World Conference on Photovoltaic Energy Conversion (2003) 3P-C3-55

DISCLOSURE OF THE INVENTION

While the conventional cover glass can achieve adequate thermal radiative and optical characteristics in a specific type of space solar cell, such as a crystal-based solar cell, it is inappropriate to apply the cover glass directly to a thin-film solar cell in terms of weight and flexibility. Moreover, the conventional cover glass has a problem about increase in weight of a solar cell due to adhesive used therein. In view of the above circumstances, it is therefore an object of the present invention to provide a technique for an optical thin film capable of being reduced in thickness to allow a thin-film solar cell to have thermal radiative and optical characteristics equivalent to those in the conventional space solar cell. Specifically, it is an object of the present invention to provide a technique for an optical thin film, as an alternative to the conventional cover glass, capable of being maximally reduced in thickness to allow an on-ground thin-film solar cell to have enhanced infrared emissivity, while suppressing unnecessary incoming solar radiation in a simplified structure to achieve a reduced solar absorption factor of solar radiation (solar absorptivity), so as to maintain desired cell efficiency. It is another object of the present invention to provide a technique for an optical thin film capable of contributing to reduction in weight of a thin-film solar cell for space.

In order to achieve the above objects, the present invention is characterized in that an optical thin film as an alternative to the conventional cover glass is formed directly on a thin-film solar cell.

Specifically, according a first aspect of the present invention, there is provided an optical thin film for use with a thin-film solar cell which includes a substrate, a back electrode layer formed on an upper surface of the substrate, a photovoltaic layer formed on an upper surface of the back electrode layer, and a transparent conductive film layer formed on an upper surface of the photovoltaic layer to define a top surface of the thin-film solar cell. The optical thin film is characterized by being formed directly on the top surface of the thin-film solar cell to provide a high infrared emissivity and a low solar absorptivity to the thin-film solar cell.

In the first aspect of the present invention, the optical thin film is preferably formed through a vacuum vapor deposition process at a film-formation temperature of about 160° C. or less. Preferably, the optical thin film comprises a laminated oxide coating formed of a plurality of different oxide layers.

Preferably, the laminated oxide coating includes a silicon dioxide layer and an aluminum oxide layer which are formed relative to the top surface of the thin-film solar cell in this order. More preferably, the laminated oxide coating includes an auxiliary aluminum oxide layer formed directly on the top surface of the thin-film solar cell, and a silicon dioxide layer and a second aluminum oxide layer which are formed on the auxiliary aluminum oxide layer in this order.

As one preferred embodiment, the optical thin film may further comprise a multilayer coating formed on a top surface of the laminated oxide coating. The multilayer coating includes a combination of a layer made of a relatively low refractive-index material and a layer made of a relatively high refractive-index material. In this case, the low refractive-index material may consist of silicon dioxide or magnesium fluoride, and the high refractive-index material may consist of niobium pentoxide or titanium oxide. Preferably, each of the layers of the optical thin film has a thickness ranging from about 50 to 3000 nm. During the use of the optical thin film set forth in the first aspect of the present invention, the optical thin film exhibits an infrared emissivity of about 75% or more, and a solar absorptivity of about 80% or less.

According to a second aspect of the present invention, there is provided a method of forming an optical film on a thin-film solar cell which includes a substrate, a back electrode layer formed on an upper surface of the substrate, a photovoltaic layer formed on an upper surface of the back electrode layer, and a transparent conductive film layer formed on an upper surface of the photovoltaic layer to define a top surface of the thin-film solar cell. The method comprises forming a multilayer optical thin film capable of providing a high infrared emissivity and a low solar absorptivity to the thin-film solar cell, directly on the top surface of the thin-film solar cell.

According to a third aspect of the present invention, there is provided a solar cell structure comprising: a thin-film solar cell including a substrate, a back electrode layer formed on an upper surface of the substrate, a photovoltaic layer formed on an upper surface of the back electrode layer, and a transparent conductive film layer formed on an upper surface of the photovoltaic layer to define a top surface of the thin-film solar cell; and an optical thin film formed directly on the top surface of the thin-film solar cell and adapted to provide a high infrared emissivity and a low solar absorptivity to the thin-film solar cell.

In the present invention, the optical thin film is formed through a vacuum vapor deposition process. As used in this specification, the term "vacuum vapor deposition process" means a process of depositing a vaporized material on a surface of a target member to form a film on the surface. Preferably, the optical thin film is formed through an electron-beam vapor deposition process or an ion plating process. Considering damages to the thin-film solar cell and radiation heat from a vapor source, a substrate temperature during the film-forming process is maintained at 160° C. or less. Further, oxygen is appropriately introduced during vapor deposition to prevent absorption in a solar wavelength range.

In order to obtain enhanced infrared emissivity, an oxide coating is formed on the transparent conductive film which is a top layer of the thin-film solar cell. As used in this specification, the term "transparent conductive film" means any material which exhibits transparency in the visible region and electrical conductivity. The oxide coating fundamentally comprises a silicon dioxide layer and an aluminum oxide layer. In a process of forming the oxide coating, an auxiliary aluminum oxide layer is thinly formed directly on the transparent conductive film according to need to ensure adequate contact with the transparent conductive film, and then the silicon dioxide layer and the aluminum oxide layer are formed on the optional aluminum oxide layer in this order to obtain the oxide coating. An optimal thickness of the oxide coating is determined by a carrier concentration of the transparent conductive film.

Further, an optical coating for controlling unnecessary incoming solar radiation is formed on the oxide coating for providing enhanced infrared emissivity. The optical coating is formed as a multilayer coating including a combination of a layer made of a relatively low refractive-index material and a layer made of a relatively high refractive-index material. Preferably, a silicon dioxide layer and a magnesium fluoride layer are formed as the low refractive-index material layer, and a niobium pentoxide layer or a titanium oxide layer is formed as the high refractive-index material layer. Optical characteristics vary depending on the substrate temperature. Thus, a thickness and a multilayer structure of the optical coating are optimized according to the substrate temperature.

A preferred embodiment of the present invention can be summarized as follows:

(1) In space applications of a thin-film solar cell having a top layer formed of a transparent conductive film layer, the optical thin film is formed on the outermost surface of the thin-film solar cell;

(2) The optical thin film is formed through a vacuum vapor deposition process, and a film-formation temperature is set in the range of room temperature to 160° C.;

(3) A portion of the optical thin film for providing enhanced infrared emissivity fundamentally comprises an oxide coating formed of a combination of a plurality of different oxide layer;

(4) More preferably, the oxide coating consists of two layers: a silicon dioxide layer and an aluminum oxide layer. According to need, the two layers may be formed on an auxiliary aluminum oxide layer which is formed on the outermost surface of the thin-film solar cell in advance;

(5) A portion of the optical thin film for suppressing unnecessary incoming solar radiation comprises an optical coating including a combination of a low refractive-index material layer and a high refractive-index material layer. This optical coating is formed on the oxide layer for providing enhanced infrared emissivity;

(6) More preferably, a silicon dioxide layer and a magnesium fluoride layer are formed as the low refractive-index material layer includes, and a niobium pentoxide layer or a titanium oxide layer is formed as the high refractive-index material layer; and (7) Each of the layers in the optical thin film has a thickness ranging from 50 to 3000 nm.

The optical thin film of the present invention can be laminated on a surface of a solar cell to provide adequate thermal radiative characteristics (solar absorptivity and infrared emissivity) and control incoming solar radiation and infrared emission from the solar cell, so as to eliminate the need for the conventional cover glass which has been essential to solar cells.

BEST MODE FOR CARRYING OUT THE INVENTION

Figure 1:
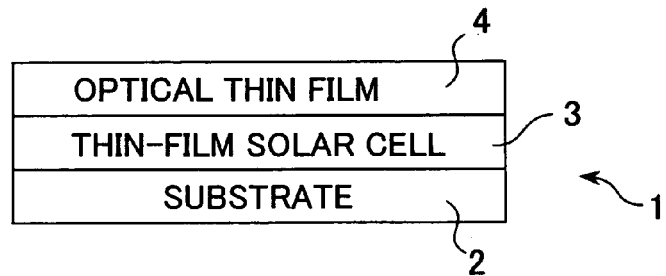
FIG. 1 is a schematic sectional view showing a configuration of a solar cell structure incorporating an optical thin film according to one embodiment of the present invention.
Figure 5:
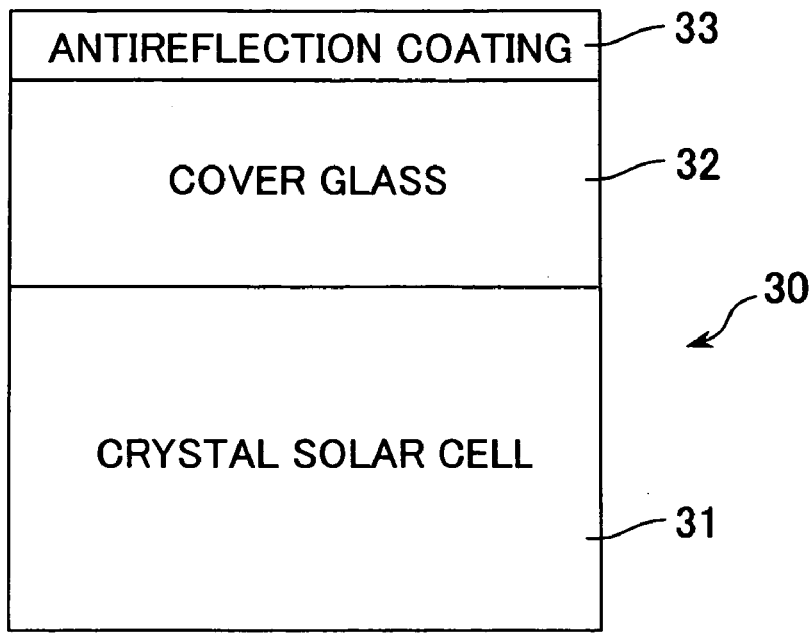
FIG. 5 is a schematic sectional view showing a multilayer configuration of a conventional solar cell structure which has a cover glass adhesively attached on a surface of a crystal solar cell, and an antireflection coating formed on a surface of the cover glass.
Figure 6:
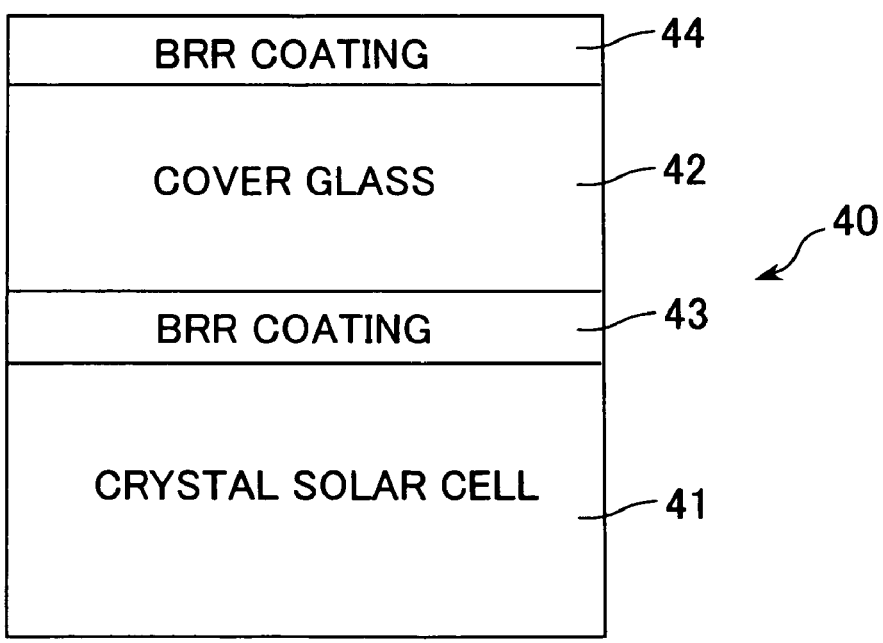
FIG. 6 is a schematic sectional view showing a multilayer configuration of another conventional solar cell structure which has a cover glass adhesively attached on a surface of a crystal solar cell, and an antireflection coating formed on a surface of the cover glass.

With reference to the drawings, one embodiment of the present invention will now be described. FIGS. 5 and 6 are schematic sectional views showing two conventional solar cell structures 30, 40. FIG. 1 is a schematic sectional view showing a solar cell structure 1 incorporating an optical thin film according to one embodiment of the present invention. As seen in FIGS. 5 and 6, each of the conventional solar cell structures 30, 40 includes a thick cover glass layer (32, 42) for protecting a crystal solar cell (31, 41). This cover glass layer (32, 42) is attached on the crystal solar cell (31, 41) using an adhesive. In the conventional solar cell structure 30 illustrated in FIG. 5, the cover glass layer 32 is directly attached on a top surface of the crystal solar cell 31, and an antireflection coating 33 is formed on an upper surface of the cover glass layer 32. In the conventional solar cell structure 40 illustrated in FIG. 6, the cover glass layer 42 is attached relative to a top surface of the crystal solar cell 41 while interposing a Blue Red Reflector (BRR) coating 43 therebetween, and another BRR coating 44 is formed on an upper surface of the cover glass layer 42 to define a top surface of the solar cell structure 40.

In the solar cell structure 1 illustrated in FIG. 1, an optical thin film 4 according to one embodiment of the present invention is formed directly on a top surface of a thin-film solar cell 3 including a substrate 2, through a vacuum vapor deposition process. During a process of forming the optical thin film 4, a temperature of the substrate 2 is controlled in such a manner as to allow the thin-film solar cell 3 to be kept at a temperature less than a value causing no damage thereof in consideration of radiation heat from a vapor source. Further, in the film-forming process, oxygen is appropriately introduced during vapor deposition to prevent absorption in a solar wavelength range effective in photoelectric conversion.

Figure 2:
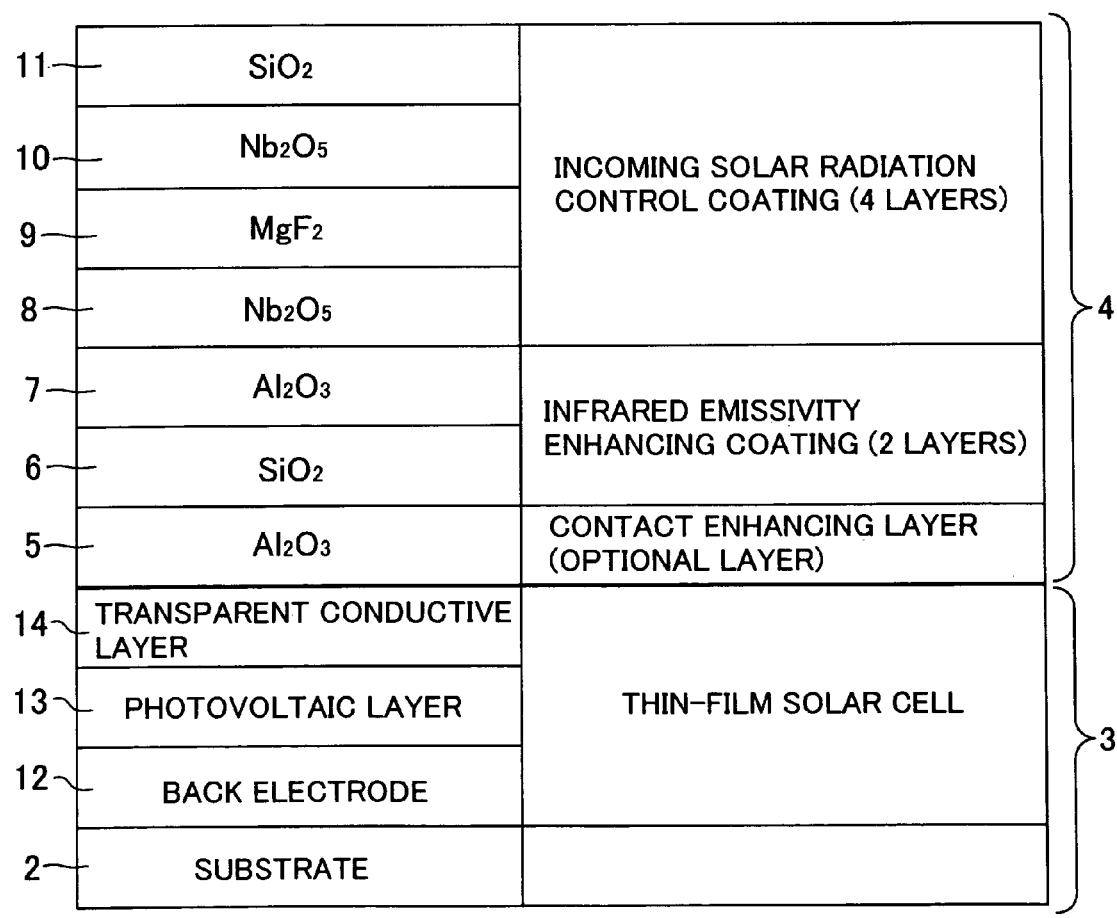
FIG. 2 is a sectional view showing the multilayer structure of the optical thin film according to one embodiment, together with a solar cell formed therewith.

FIG. 2 is a sectional view showing a multilayer structure of the optical thin film 4. In this multilayer structure, an optional aluminum oxide ($Al_2O_3$) layer 5 is thinly formed on a transparent conductive film of the thin-film solar cell in advance to provide enhanced contact with a top surface of the solar cell. Then, a silicon dioxide ($SiO_2$) layer 6 and an aluminum oxide ($Al_2O_3$) layer 7 are formed on the optional aluminum oxide ($Al_2O_3$) layer 5, respectively, at a thickness ranging from 1000 to 3000 nm and a thickness ranging from 100 to 500 nm. These two layers 6, 7 or an oxide coating serve as a means to provide enhanced infrared emissivity. Further, a niobium pentoxide ($Nb_2O_5$) layer 8, a magnesium fluoride ($MgF_2$) layer 9, a niobium pentoxide ($Nb_2O_5$) layer 10 and a silicon dioxide ($SiO_2$) layer 11 are formed on the aluminum oxide ($Al_2O_3$) layer 7 in this order each at a thickness ranging from about 50 to 300 nm. These four layers or an optical coating serve as a means to control incoming solar radiation while optimizing thermal radiative and optical characteristics of the solar cell structure in consideration of an optical interference effect relative to the two layers 6, 7 located immediately therebelow. The thickness of each layer of the optical thin film illustrated in FIG. 2 may be appropriately adjusted depending on characteristics of a thin-film solar cell associated therewith.

The thin-film solar cell 3 in this embodiment comprises the substrate 2, a back electrode layer 12 formed on an upper surface of the substrate 2, a photovoltaic layer 13 formed on an upper surface of the back electrode layer 12 and a transparent conductive film layer 14 formed on an upper surface of the photovoltaic layer 13 to serve as a top layer of the thin-film solar cell 3.

Then, the optional aluminum oxide ($Al_2O_3$) layer 5 is formed on an upper surface of transparent conductive film layer 14 to provide enhanced contact with the top surface of the thin-film solar cell 3, as mentioned above.

Figure 3:
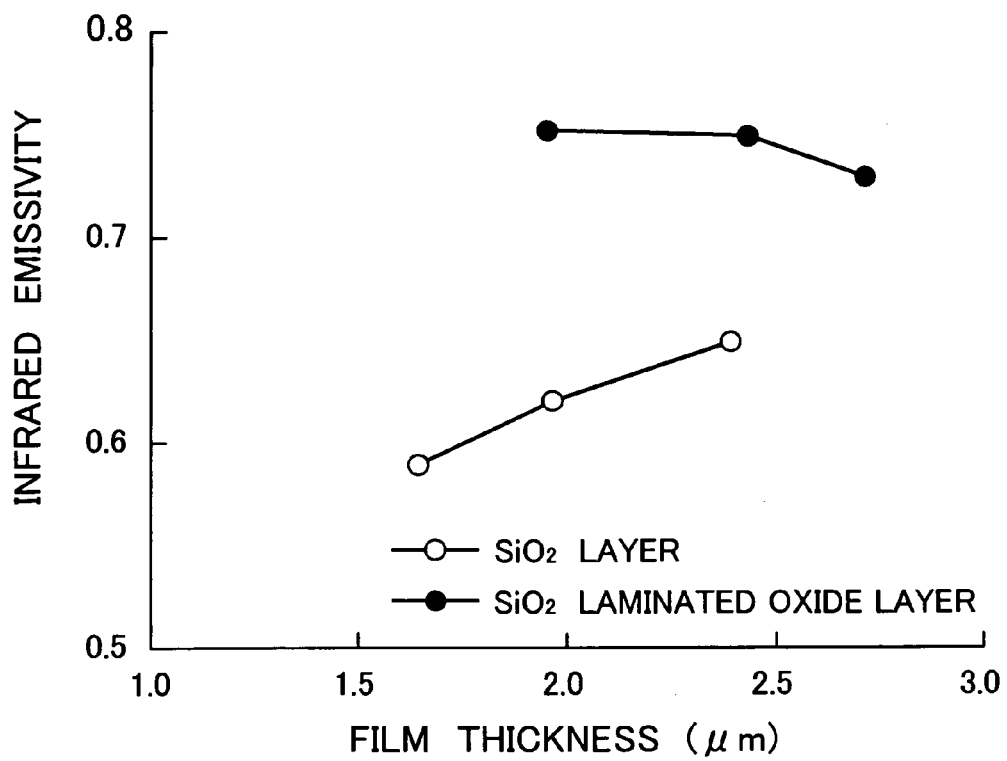
FIG. 3 is a graph showing a measurement result of a film-thickness dependence of an infrared emissivity in a thin-film solar cell formed with an oxide coating in the optical thin film.

FIG. 3 shows a measurement result of a film-thickness dependence of an infrared emissivity in a thin-film solar cell formed with the above oxide coating. In this measurement, a Cu (In, Ga) $Se_2$ thin-film solar cell was used as a thin-film solar cell serving as a target member. A transparent conductive film as a top layer was a zinc oxide (ZnO) layer doped with aluminum (Al) in a level of $10^{20}$ $cm^{-3}$. In FIG. 3, ○ indicates a measurement result of the thin-film solar cell formed with only a silicon dioxide ($SiO_2$) layer, and ● indicates a measurement result of the thin-film solar cell having the silicon dioxide ($SiO_2$) layer and an aluminum oxide ($Al_2O_3$) layer formed on the silicon dioxide layer. FIG. 3 shows that a combination of the silicon dioxide ($SiO_2$) layer and the aluminum oxide ($Al_2O_3$) layer provides a higher infrared emissivity than only the silicon dioxide ($SiO_2$) layer even if the latter single layer has the same thickness as the former combination layer. As compared with an infrared emissivity of about 0.2 in a thin-film solar cell without the oxide coating, a thin-film solar cell with the optical thin film of the present invention can provide an infrared emissivity of 0.75 or more. An original infrared emissivity of a thin-film solar cell varies depending on a carrier concentration of a transparent conductive film thereof. Thus, an optimal thickness of the oxide coating is appropriately adjusted according to the carrier concentration of the transparent conductive film.

Figure 4:
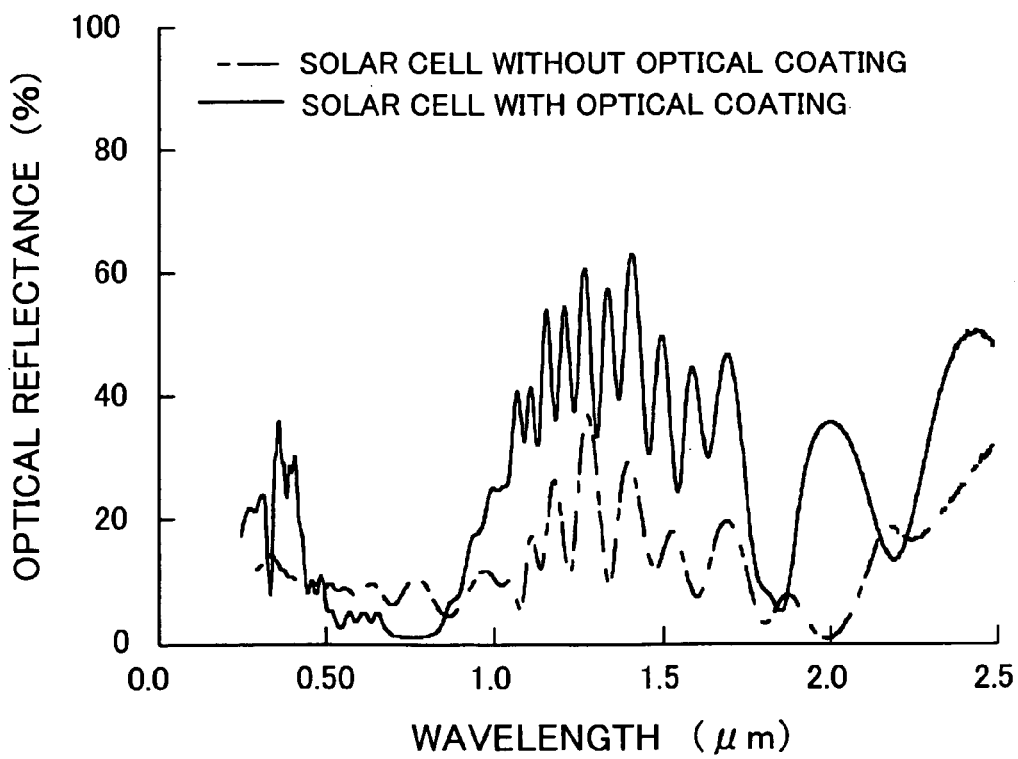
FIG. 4 is a graph showing a measurement result of a wavelength dependence of an optical reflectance in each of a thin-film solar cell formed with the optical thin film and a thin-film solar cell structure formed with no optical thin film.

FIG. 4 shows a measurement result of a wavelength dependence of an optical reflectance in each of a thin-film solar cell formed with the optical thin film according to this embodiment and a thin-film solar cell structure formed with no optical thin film.

As seen in FIG. 4, the thin-film solar cell formed with the optical thin film exhibits higher reflectance in ultraviolet and near-infrared regions. Based on this effect, in the thin-film solar cell formed with the optical thin film according to this embodiment, an original solar absorptivity of about 0.9 could be reduced to about 0.83. This proves that the thin-film solar cell formed with the optical thin film has thermal radiative characteristics approximately equal to those of the conventional solar cell with the cover glass (solar absorptivity: about 0.8, infrared emissivity: about 0.80 to 0.85).

The present invention has been described based on one specific embodiment. It is understood that the present invention may be implemented in various other forms.

For example, while the optical thin film in the above embodiment has been formed through a vacuum vapor deposition process, any other suitable film-forming process, such as a sputtering process or a CVD process, may be used. Further, the present invention may be applied to any other type of thin-film solar cell having a top layer formed of a transparent conductive layer, such as a-Si solar cells, so as to appropriately modify the structure thereof.

Further, it will be understood by those skilled in the art that various other modifications and changes may be made based on knowledge of the present invention, and it is understood that such modifications and changes are also encompassed within the scope of the present invention. While an original infrared emissivity of a thin-film solar cell is about 0.20, the optical thin film of the present invention makes it possible to increase the infrared emissivity to three times or more. In addition, the optical thin film can control incoming solar radiation in a simplified structure to provide a reduced solar absorptivity as compared with an original solar absorptivity of the thin-film solar cell. Thus, a thin-film solar cell with the optical thin film can achieve thermal radiative characteristics equivalent to those in the conventional space solar cell with the cover glass. Specifically, the thin-film solar cell with the optical thin film can maintain a maximum temperature thereof at about 50 to 60° C. in space environments. The optical thin film capable of providing not only enhanced infrared emissivity but also reduced solar absorptivity makes it possible to maintain a thin-film solar cell at an adequate temperature in space environments. This prevents deterioration in cell efficiency and leads to enhanced reliability.

INDUSTRIAL APPLICABILITY

As an alternative to the conventional cover glass, the optical thin film of the present invention is formed directly on a solar cell. While the conventional techniques require using the cover glass having a thickness of about 100 μm, functions of the conventional cover glass can be achieved by using the optical thin film of the present invention formed at a thickness of only 2 to 3 μm to a satisfactory extent. This makes it possible to achieve reduction in weight of the entire solar cell. In addition, the need for using an adhesive to attach the conventional cover glass onto a solar cell can be eliminated to further reduce the weight. This contributes to reduction in weight of solar cell paddles and a spacecraft.

What is claimed is:

1. A solar cell structure, comprising:
a substrate,
a solar cell including a back electrode layer formed on an upper surface of said substrate,
a photovoltaic layer formed on an upper surface of said back electrode layer, and
a transparent conductive film layer formed on an upper surface of said photovoltaic layer, and
an optical thin film in which a first silicon dioxide ($SiO_2$) layer, an aluminum oxide ($Al_2O_3$) layer, a niobium pentoxide ($Nb_2O_5$) layer, a magnesium fluoride (MgF2) layer, a niobium pentoxide ($Nb_2O_5$) layer, and a second silicon dioxide ($SiO_2$) layer are formed directly on the transparent conductive film layer in the aforementioned order, wherein the aluminum oxide ($Al_2O_3$) layer directly follows and contacts the first silicon dioxide layer.

2. A solar cell structure as defined in claim 1, which is formed through a vacuum vapor deposition process at a film-formation temperature of about 160° C. or less.

3. A solar cell structure as defined in claim 1, which is formed through an electron-beam vapor deposition process.

4. A solar cell structure as defined in claim 1, which is formed through an ion plating process.

5. A solar cell structure as defined in claim 1 in which a thickness of the first silicon dioxide ($SiO_2$) layer directly formed on the transparent conductive film layer is ranged from 1000-3000 nm.

6. A solar cell structure as defined in claim 1 in which a thickness of the aluminum oxide ($Al_2O_3$) layer formed on the silicon dioxide ($SiO_2$) layer is ranged from 100-500 nm.

7. A solar cell structure, comprising:
a substrate,
a solar cell including a back electrode layer formed on an upper surface of said substrate,
a photovoltaic layer formed on an upper surface of said back electrode layer, and
a transparent conductive film layer formed on an upper surface of said photovoltaic layer, and
an optical thin film in which a first aluminum oxide ($Al_2O_3$) layer, a first silicon dioxide ($SiO_2$) layer, a second aluminum oxide ($Al_2O_3$) layer, a niobium pentoxide ($Nb_2O_5$) layer, a magnesium fluoride (MgF2) layer, a niobium pentoxide ($Nb_2O_5$) layer, and a second silicon dioxide ($SiO_2$) layer are formed directly on the transparent conductive film layer in the aforementioned order wherein the first silicon dioxide (SiO2) layer resides directly between and contacts the first aluminum oxide ($Al_2O_3$) layer and the second aluminum oxide ($Al_2O_3$) layer.

* * * * *